US010084422B1

(12) United States Patent
Elzeftawi

(10) Patent No.: US 10,084,422 B1
(45) Date of Patent: Sep. 25, 2018

(54) METHOD AND APPARATUS FOR PROVIDING A VARIABLE GAIN AMPLIFIER

(71) Applicant: Xilinx, Inc., San Jose, CA (US)

(72) Inventor: Mohamed N. Elzeftawi, San Jose, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/371,687

(22) Filed: Dec. 7, 2016

(51) Int. Cl.
*H03F 3/45* (2006.01)
*H03G 3/30* (2006.01)
*H03G 1/00* (2006.01)

(52) U.S. Cl.
CPC .......... *H03G 3/30* (2013.01); *H03F 3/45192* (2013.01); *H03F 2203/45018* (2013.01); *H03F 2203/45026* (2013.01)

(58) Field of Classification Search
USPC .......................................... 330/252–261, 283
See application file for complete search history.

(56) References Cited

U.S. PATENT DOCUMENTS 5,418,494 A * 5/1995 Betti ................... H03G 1/0023
330/254
6,583,668 B1 * 6/2003 Liu ..................... H03G 1/0023
330/254

OTHER PUBLICATIONS

Ray, Sagar et al., "A 10Gb/s Inductorless AGC amplifier with 40dB Linear Variable Gain Control in 0.13μm CMOS", IEEE Journal of Solid-State Circuits, Feb. 2016, pp. 440-456, vol. 51, No. 2, JSSC.
Lee, Hui Dong et al. "A Wideband CMOS Variable Gain Amplifier with an Exponential Gain Control", IEEE Transactions on Microwave Theory and Techniques, Jun. 2007, pp. 1363-1373, vol. 55, No. 6.

* cited by examiner

*Primary Examiner* — Hieu Nguyen
(74) *Attorney, Agent, or Firm* — Kin-Wah Tong; Carleton Clauss

(57) ABSTRACT

An integrated circuit and method for providing a variable gain amplifier are disclosed. One embodiment of the a variable gain amplifier comprises at least one load, a cascode circuit coupled to the load, a folded-gilbert stage, coupled to the cascode circuit, the folded-gilbert stage comprising a main differential pair of transistors and an internal pair of transistors, and a digital to analog converter, coupled to the folded-gilbert stage, for steering currents between the main differential pair of transistors and the internal pair of transistors to change a gain of the variable gain amplifier.

20 Claims, 4 Drawing Sheets

METHOD AND APPARATUS FOR PROVIDING A VARIABLE GAIN AMPLIFIER

FIELD OF THE DISCLOSURE

The present disclosure relates generally to integrated circuits and more particularly, to a variable gain amplifier (VGA), e.g., having fine gain-steps, a wide gain tuning range, a constant output common mode, and a small bandwidth variation over gain code.

BACKGROUND OF THE DISCLOSURE

The analog front-end of a receiver usually needs a variable gain amplifier (also known as an automatic gain control). However, some automatic gain control designs may suffer from parasitic peaking at lower gain codes. For example, the peaking may occur due to the parasitic capacitance at the tail node which, together with bigger resistor values for the degeneration resistor, $R_S$, may cause this undesired parasitic peaking. In addition to the parasitic peaking, the automatic gain control's gain settings are discrete that depend on the number of programmable branches used to tune the degeneration resistor, $R_S$. This, in turn, may cause several design trade-offs. For example, using more branches to create finer gain-steps, will lead to more parasitics and more un-desired peaking. The degeneration resistor, $R_S$ also causes the gain to vary significantly over resistor corners as the load resistor, $R_L$, is calibrated to keep a constant bandwidth while $R_S$ is not calibrated to minimize the parasitic capacitance. Due to the parasitic peaking at lower gain codes, additional load capacitors needed to be provided to reduce the parasitic peaking and bandwidth, but this approach wastes silicon area.

SUMMARY

The present disclosure provides an integrated circuit and a method for providing a variable gain amplifier. One example of the variable gain amplifier comprises at least one load, a cascode circuit coupled to the at least one load, a folded-gilbert stage, coupled to the cascode circuit, the folded-gilbert stage comprising a main differential pair of transistors and an internal pair of transistors, and a digital to analog converter, coupled to the folded-gilbert stage, for steering currents between the main differential pair of transistors and the internal pair of transistors to change a gain of the variable gain amplifier.

According to another example, a method of providing a variable gain amplifier is provided. The method comprises applying a voltage to a cascode circuit, to control a gain of the variable gain amplifier comprising a folded-gilbert stage having a main differential pair of transistors and an internal pair of transistors, and steering currents between the main differential pair of transistors and the internal pair of transistors via a digital to analog converter for contributing to a change of the gain of the variable gain amplifier.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

To facilitate understanding, identical reference numerals have been used, where possible, to designate identical elements that are common to the figures.

DETAILED DESCRIPTION OF THE DRAWINGS

The present disclosure provides a variable gain amplifier (VGA) with fine gain-steps, a wide gain tuning range, a constant output common mode, and a small bandwidth variation over gain code. Additionally, the VGA of the present disclosure minimizes parasitic peaking at lower gain codes or settings.

As discussed above, some automatic gain control designs may suffer from parasitic peaking at lower gain codes. In addition to the parasitic peaking, the automatic gain control's gain settings may be discrete that depend on the number of fixed programmable branches where more branches are used to create finer gain-steps, but at the expense of leading to more un-desired parasitic peaking.

In one embodiment, the present disclosure provides a variable gain amplifier having a folded-Gilbert stage or cell having a main differential pair of transistors and an internal or auxiliary pair of transistors. In one example, a cascade circuit is also employed to control the gain of the variable gain amplifier. The variable gain amplifier may also employ a digital to analog converter (DAC) (e.g., a current digital to analog converter (iDAC) or a voltage digital to analog converter) for steering the currents between the main differential pair of transistors and the internal pair of transistors of the folded-Gilbert stage or cell. In one further embodiment, a bleeder circuit is employed in the variable gain amplifier to ensure the output's common mode levels.

The structure of the present variable gain amplifier exhibits certain features in addition to minimizing the parasitic peaking at lower gain codes. For example, the present variable gain amplifier removes the gain variation over resistor corners as the present structure does not rely on resistor degeneration. The present structure also provides much finer gain steps and the architecture can be programmed to have any pre-set values of gain settings depending on the DAC resolution. For example, the DAC resolution may be implemented with a range of 4-8 bits leading to a range of 16-128 different gain settings. However, it should be noted that the present disclosure is not limited to any specific DAC resolution. Furthermore, the present structure may also provide the feature where the process-dependent gain variation can be eliminated post-silicon by simply re-mapping the range used in the DAC to control the gain. For example, 64 gain settings can be dynamically remapped into 32 gain settings via the DAC. Furthermore, the bandwidth variation over gain code can be made much smaller (e.g., less than 4 GHz) and can be made to be substantially constant but at the expense of more Input/Output loading.

Figure 1:
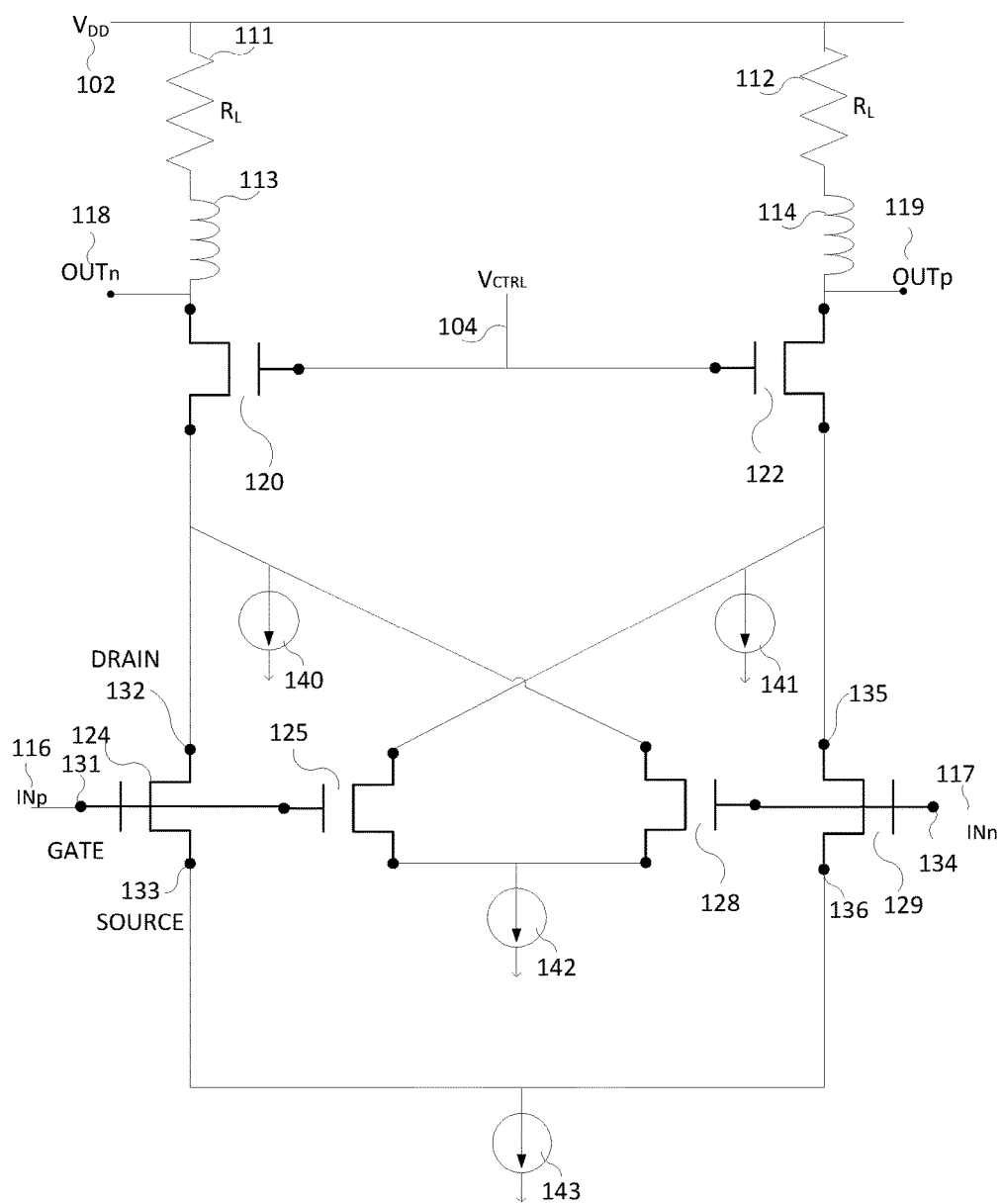
FIG. 1 illustrates an example of a variable gain amplifier of the present disclosure.

FIG. 1 illustrates an example of a variable gain amplifier 100 of the present disclosure. In one embodiment, the present VGA architecture relies on a folded-Gilbert stage or cell and a cascode circuit to control the gain of the variable gain amplifier 100. Broadly, the cascode circuit is connected to a biasing voltage and is not connected to the signals of the device. In one example, the folded-Gilbert stage or cell comprises a main differential pair of transistors 124 and 129 and an internal pair of transistors 125 and 128, and the cascode circuit comprises transistors 120 and 122. Although the transistors of the variable gain amplifier 100 are illustrated as n-channel metal-oxide semiconductor field-effect transistors (NMOSs), these transistors can be implemented as p-channel metal-oxide semiconductor field-effect transistors (PMOSs) with the load being connected to ground instead of a supply voltage $V_{dd}$ 102 as shown in FIG. 1.

In one embodiment, the present VGA architecture employs a corresponding pair of a resistor (111 or 112) and an inductor (113 or 114) as a respective load for the output 118 $OUT_p$ (broadly a first output) and the output 119 $OUT_n$ (broadly a second output). A resistor and an inductor will be referred broadly as a load. It should be noted that the load can be implemented in other forms aside from what is shown in FIG. 1 (e.g., removing or replacing the inductor) and are therefore within the scope of the present disclosure.

In one embodiment, the cascade circuit (e.g., transistors 120 and 122) is operated under a control voltage, $V_{ctrl}$. For example, increasing the control voltage, $V_{ctrl}$ will increase the gain of the variable gain amplifier 100 and decreasing the control voltage, $V_{ctrl}$, will decrease the gain of the variable gain amplifier 100. This operation is referred to as cascode tuning. However, cascode tuning may only provide a limited gain range, e.g., 5 dB of gain range. One reason is that although decreasing the control voltage, $V_{ctrl}$, may provide more range, such action may decrease the headroom for the tail devices of the variable gain amplifier and pushes the differential-pair transistors into the linear region which leads to bowing in large signal linearity test.

Figure 2:
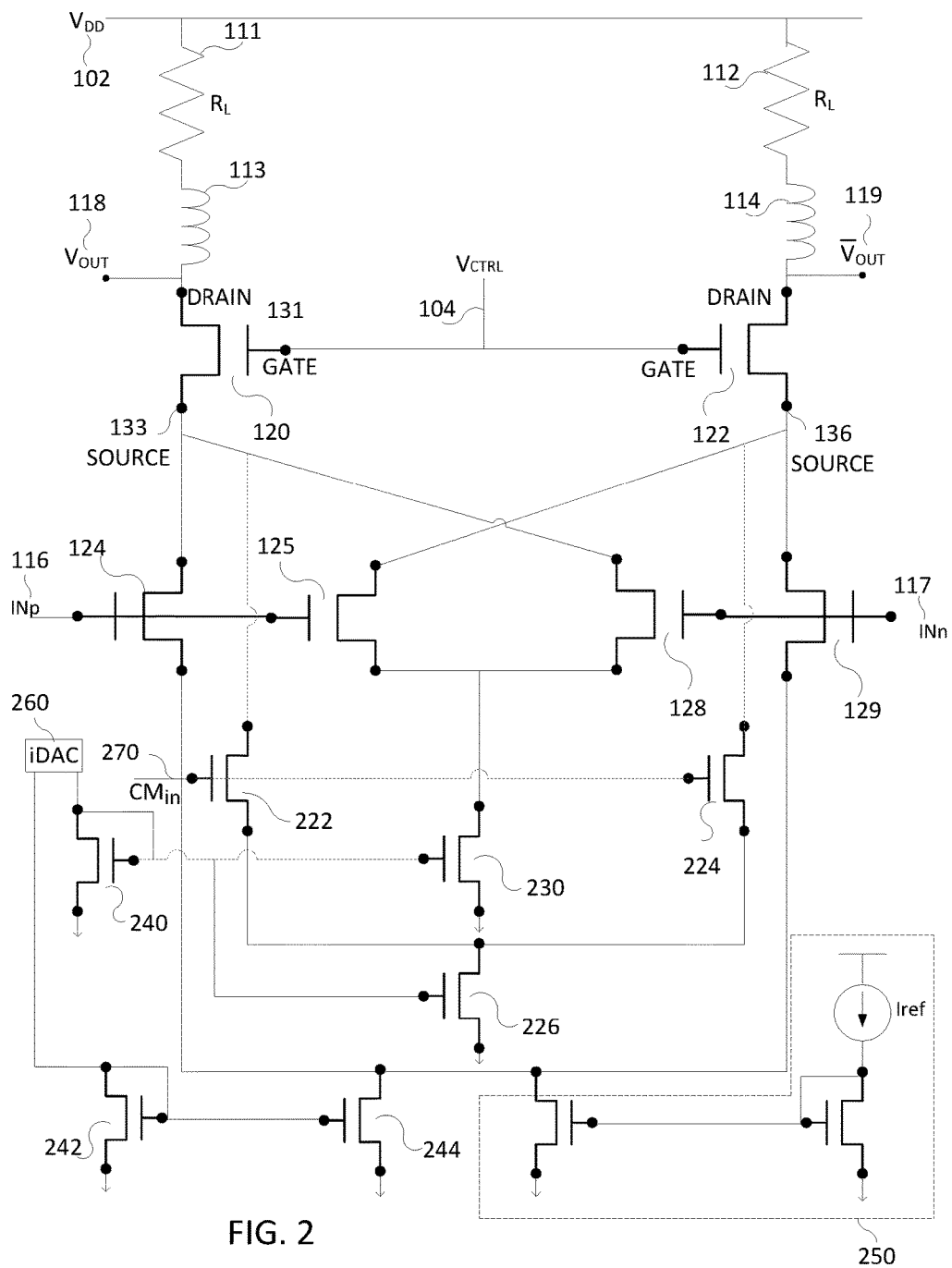
FIG. 2 illustrates another example of a variable gain amplifier of the present disclosure.

In the present disclosure, the folded-gilbert stage or cell (e.g., transistors 124, 125, 128 and 129) mixes the two output signals with 180° phase shift to control the output amplitude. By steering some current, e.g., ΔI, from the main differential-pair transistors (124 and 129) to the internal differential-pair transistors (125 and 128), the gain of the variable gain amplifier is reduced. In one embodiment, steering the current is accomplished by using a DAC 260 (e.g., an iDAC 260 as shown in FIG. 2). In one embodiment, a factor of K (≥1) is used for scaling the internal differential-pair transistors (125 and 128) to reduce the loading at the inputs (116 and 117) and outputs (118 and 119). If K is set to 1, the gain steps are very linear with respect to ΔI but the bandwidth slightly degrades (but will remain relatively constant versus gain code) and the input loading can now be made to be twice as large. With larger values of K, there will be less input/output loading but the bandwidth may vary to a lesser degree, e.g., by about 4 GHz versus gain code. This lower bandwidth difference or variation is still less than existing designs. Larger K values also mean ΔI will need to be larger to achieve the smallest gain setting, which makes the linearity slightly worse at lowest gain settings when compared to lower K values, e.g., when K=1.

In one example, the scaling factor K is set to be 8 to minimize the input loading and the control voltage $V_{ctrl}$ and ΔI are controlled together using the DAC 260. Alternatively, it should be noted that the control voltage $V_{ctrl}$ can be controlled independently, i.e., without being controlled by the DAC 260. In one example, the DAC 260 is a 6-bit DAC which leads to 64 fine gain settings. As indicated above, a finer or coarser DAC can be used instead to meet the requirements of a particular application.

It has been found that the architecture of the present variable gain amplifier is able to provide 64 gain settings with 15 dB gain range and virtually no un-desired peaking. The bandwidth is also relatively constant and changes by about 4 GHz over gain code. Good linearity and constant output common mode are also achieved with the architecture of the present variable gain amplifier 100. Furthermore, any other gain variations due to process, can be dynamically calibrated post-silicon by simply adjusting the range to be used in the DAC 260.

FIG. 1 also illustrates four current sources 140, 141, 142 and 143. As further discussed below, the variable gain amplifier of the present disclosure uses a folded-gilbert stage or cell having a main differential-pair of transistors and an internal pair of differential-pair transistors. In one example, a DAC, e.g., iDAC 260, is used to control the gain through varying the tail current 143 of the main differential-pair of transistors and the tail current 142 of the internal pair of differential-pair transistors. Furthermore, since only 1/K of the iDAC current flows through tail device, the remaining iDAC current, e.g., (K−1)/K, is steered to a bleeder circuit that is broadly represented by current sources 140 and 141. The current that is steered to the bleeder circuit is broadly referred to as the residual current. An illustrative example as to how these four current sources 140, 141, 142 and 143 are implemented is discussed further below with reference to FIG. 2. However, other implementations of these four current sources 140, 141, 142 and 143 are within the scope of the architecture of the present variable gain amplifier.

FIG. 2 illustrates another example of a variable gain amplifier 200 of the present disclosure. The variable gain amplifier 200 is similar to the variable gain amplifier 100 of the FIG. 1 with the exception where the various current sources are illustrated with specific circuitry. It should be noted that the various current sources can be implemented in other manners from those illustrated in FIG. 2 which are still within the scope of the present disclosure.

The variable gain amplifier 200 uses a folded-gilbert stage or cell (e.g., transistors 124, 125, 128 and 129) and a DAC, e.g., iDAC 260, to control the gain through varying the tail current 143 of transistors 124 and 129 and the tail current 142 of transistors 125 and 128. A cascode circuit (e.g., transistors 120 and 122) are also added to control the gain even further and to provide wider gain range. In one example, the load is a resistor (111 or 112) and a Tcoil (inductor 113 or inductor 114) to extend the bandwidth. However, a shunt or series peaking inductor can be used instead or even a pure resistive load without any inductors. The various devices illustrated in FIG. 2 may use NMOS transistors, but PMOS transistors can also be used instead.

The differential input signals ($In_p$ 116 and $In_n$ 117) are fed to transistors 124 and 125 and transistors 128 and 129, respectively. The positive input, $In_p$, is fed to transistors 124 and 125, while the negative input, $In_n$, is fed to transistors 128 and 129. Transistors 124 and 129 are considered the main differential pair, while transistors 125 and 128 are considered the internal differential pair which are smaller transistors (e.g., scaled by factor K) to reduce the loading. The currents generated from the main differential pair transistors 124 and 129 are summed with the currents from the internal differential pair transistors 125 and 128 at the source nodes 133 and 136 of the cascode transistors 120 and 122. However, the current of transistor 124 is summed with the current of transistor 128 whose input is of opposite polarity, such that the AC currents are equivalently subtracted. The gain can thus be programmed by changing the currents flowing through the transistors 124 and 129 with respect to the current flowing through transistors 125 and 128.

For example, to decrease the gain of the variable gain amplifier, less current should flow into the transistors 124 and 129 and more current should flow into the transistors 125 and 128. This is accomplished through using an iDAC 260 to steer the currents from the main tail device, e.g., transistor 244, to the internal tail device, e.g., transistor 230 via current emitters 240 and 242. Since only 1/K of the iDAC current flows through transistor 230, the remaining iDAC current, e.g., (K−1)/K, is steered to a bleeder circuit comprising of transistor 222, 224, and 226. The current that is steered to the bleeder circuit is broadly referred to as the residual current. This maintains the same amount of DC current flowing through the cascode transistors and the load resistors irrespective of the iDAC code. This provides the feature of maintaining the current through the cascode transistors and maintaining their transconductance, thereby maintaining the DC current flowing through the load resistors to maintain the output's common-mode level.

In one example, the cascode transistors 120 and 122 also control the gain by varying their gate voltage $V_{ctrl}$. Higher gain is achieved by using higher $V_{ctrl}$ values. The lowest value of $V_{ctrl}$ is close to the input common-mode level, CMin, 270 while the highest value can be 100 mV to 200 mV higher than that. In one embodiment, $V_{ctrl}$ can be generated from the iDAC currents of iDAC 260, in which case the iDAC codes both steer the current and change the cascode bias to change the gain. Alternatively, $V_{ctrl}$ can be decoupled from the iDAC code and separate knobs can be employed to control the gain, which can be helpful to improve linearity. In one example, to reduce the gain from the maximum gain settings, one approach may first decrease $V_{ctrl}$ to the minimum value, then follow by decreasing the current in the main differential pair transistors.

FIG. 2 also illustrates a biasing circuit 250 that will provide a fixed current to the variable gain amplifier if the current provided to transistor 244 is zero. In other words, when the variable gain amplifier is set to the lowest gain level, biasing circuit 250 will provide the fixed current to operate the device. It should be noted that the specific implementation of the biasing circuit 250 as shown is only illustrative and other form of a biasing circuit is within the scope of the present disclosure.

Figure 3:
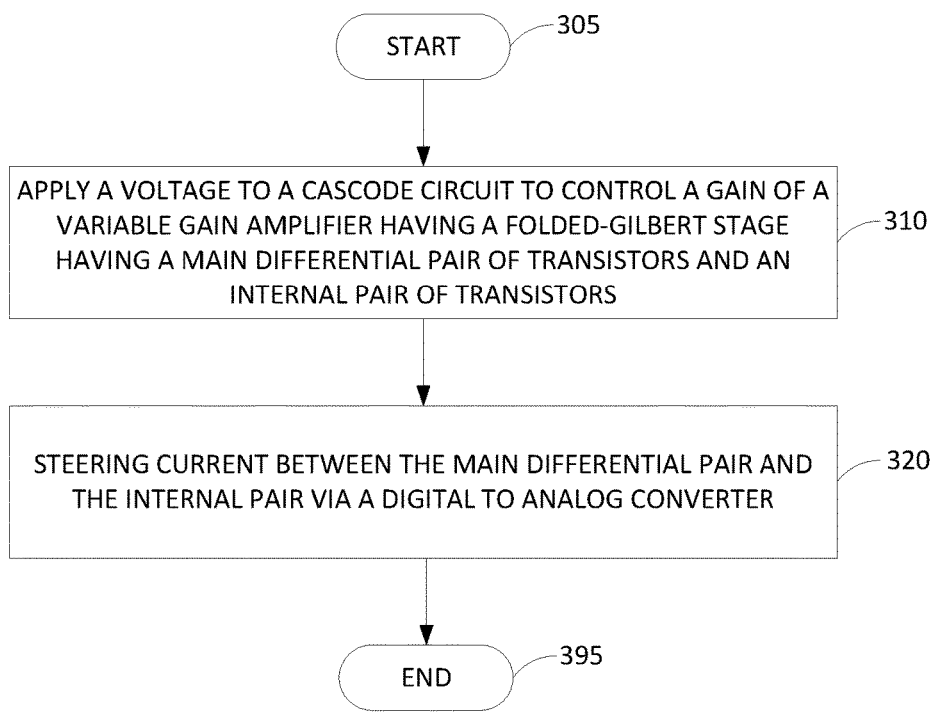
FIG. 3 illustrates a flowchart of an example method for providing a variable gain amplifier.

FIG. 3 illustrates a flowchart of a method for providing a variable gain amplifier. In one embodiment, method 300 may be implemented in an integrated circuit (IC) chip or a processor as discussed below in FIG. 4. Method 300 starts in step 305 and proceeds to step 310.

In step 310, the method 300 applies a voltage to a cascode circuit, e.g., transistors 120 and 122, to control a gain of a variable gain amplifier having a folded-gilbert stage having a main differential pair of transistors 124 and 129 and an internal pair of transistors 125 and 128.

In step 320, the method 300 steers current between the main differential pair and the internal pair via a digital to analog converter. Namely, to change the gain of the present variable gain amplifier, one approach may first change $V_{ctrl}$, then follow by changing the current in the main differential pair transistors 124 and 129.

It should be noted that although not specifically specified, one or more steps or operations of method 300 may include a storing and/or outputting step as required for a particular application. In other words, any data, records, fields, and/or intermediate results discussed in the method can be stored, displayed and/or outputted to another device as required for a particular application.

Figure 4:
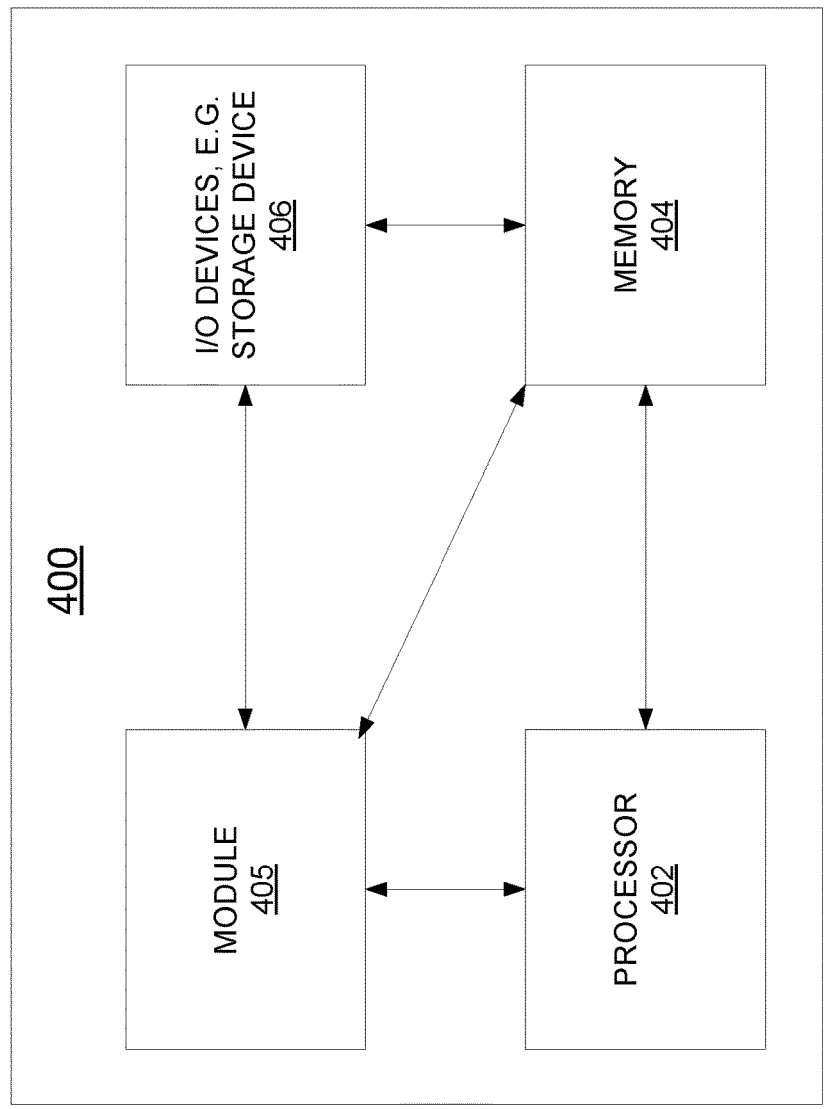
FIG. 4 depicts a high-level block diagram of a computing device suitable for use in performing the functions described herein.

FIG. 4 depicts a high-level block diagram of a computing device or a hardware device suitable for use in performing the functions described herein. As depicted in FIG. 4, the system 400 comprises a hardware processor element 402 (e.g., a CPU), a memory 404, e.g., random access memory (RAM) and/or read only memory (ROM), a module 405 for providing a variable gain amplifier, and various input/output devices 406 (e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

It should be noted that the teachings of the present disclosure can be implemented in software and hardware, e.g., using application specific integrated circuits (ASIC), a general purpose computer or any other hardware equivalents, e.g., computer readable instructions pertaining to the method(s) discussed above can be used to configure a hardware processor to perform operations of the above disclosed methods. For example, a computer-readable medium may be in communication with the processor, where the computer-readable medium storing a plurality of instructions which, when executed by the hardware processor, cause the hardware processor to perform the operations (e.g., method 300) as disclosed above.

In one embodiment, the present module or process 405 for providing a variable gain amplifier can be loaded into memory 404 and executed by processor 402 to implement the functions as discussed above. As such, the present method 405 for providing a variable gain amplifier (including associated data structures) of the present disclosure can be stored on a tangible or non-transitory (physical) computer readable medium, e.g., RAM memory, magnetic or optical drive or diskette and the like.

Examples of the present disclosure may also be implemented in whole or in part by a tunable IC, e.g., a programmable logic device (PLD) and/or Field Programmable Gate Array (FPGA). More specifically, a programmable logic device is a general-purpose device that can be programmed by a user to implement a variety of selected functions. One type of PLD is a Field Programmable Gate Array, which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources. As such, the circuits or portions of the circuits shown above in connection with FIGS. 1-2 may be implemented in a plurality of CLBs that perform equivalent logic operations of any one or more components of any one or more of the circuits or portions of the circuits of FIGS. 1-2. Thus, in one example the system 400 can be configured to generate the necessary configuration data/instructions to configure an FPGA to perform the various functions as disclosed above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A variable gain amplifier, comprising:
   at least one load;
   a cascode circuit coupled to the at least one load;
   a folded-gilbert stage, coupled to the cascode circuit, the folded-gilbert stage comprising a main differential pair of transistors and an internal pair of transistors; and
   a digital to analog converter, coupled to a gate of a first transistor that controls a tail current for the main differential pair of transistors and a gate of a second transistor that controls a tail current for the internal pair of transistors, wherein the digital to analog converter is configured to steer currents between the main differential pair of transistors and the internal pair of transistors to change a gain of the variable gain amplifier by varying respective tail currents for the main differential pair of transistors and the internal pair of transistors.

2. The variable gain amplifier of claim 1, wherein the at least one load comprises a resistor.

3. A variable gain amplifier, comprising:
   at least one load, wherein the at least one load further comprises an inductor and a resistor;
   a cascode circuit coupled to the at least one load;
   a folded-gilbert stage, coupled to the cascode circuit, the folded-gilbert stage comprising a main differential pair of transistors and an internal pair of transistors; and a digital to analog converter, coupled to the folded-gilbert stage, for steering currents between the main differential pair of transistors and the internal pair of transistors to change a gain of the variable gain amplifier.

4. The variable gain amplifier of claim 3, wherein the at least one load comprises a first pair of the resistor and the inductor for a first output and a second pair of the resistor and the inductor for a second output.

5. The variable gain amplifier of claim 1, wherein the cascode circuit comprises a pair of transistors.

6. The variable gain amplifier of claim 1, wherein a control voltage applied to the pair of transistors contributes to the change of the gain of the variable gain amplifier.

7. The variable gain amplifier of claim 5, further comprising:
   a bleeder circuit, coupled to the folded-gilbert stage, for steering currents to maintain a same amount of DC current flowing through the pair of transistors of the cascode circuit.

8. The variable gain amplifier of claim 1, wherein the digital to analog converter comprises a voltage digital to analog converter.

9. The variable gain amplifier of claim 1, wherein the digital to analog converter comprises a current digital to analog converter.

10. The variable gain amplifier of claim 1, wherein a resolution of the digital to analog converter is within a range of 4-8 bits.

11. The variable gain amplifier of claim 1, wherein the digital to analog converter enables a dynamic remapping of a range of gain settings of the variable gain amplifier.

12. The variable gain amplifier of claim 1, wherein the main differential pair of transistors and the internal pair of transistors are n-channel metal-oxide semiconductor field-effect transistors.

13. The variable gain amplifier of claim 1, wherein the main differential pair of transistors and the internal pair of transistors are p-channel metal-oxide semiconductor field-effect transistors.

14. The variable gain amplifier of claim 1, wherein the main differential pair of transistors and the internal pair of transistors are scaled relative to each other by a factor of K, where K is an integer greater than or equal to 1.

15. The variable gain amplifier of claim 5, further comprising:
   a biasing circuit, coupled to the folded-gilbert stage, for providing a fixed current.

16. A method of providing a variable gain amplifier, comprising:
   applying a voltage to a cascode circuit, to control a gain of the variable gain amplifier comprising a folded-gilbert stage having a main differential pair of transistors and an internal pair of transistors; and
   steering currents between the main differential pair of transistors and the internal pair of transistors via a digital to analog converter for contributing to a change of the gain of the variable gain amplifier by varying respective tail currents for the main differential pair of transistors and the internal pair of transistors, wherein the digital to analog converter is coupled to a gate of a first transistor that controls a tail current for the main differential pair of transistors and a gate of a second transistor that controls a tail current for the internal pair of transistors.

17. The method of claim 16, wherein the digital to analog converter comprises a current digital to analog converter.

18. The method of claim 16, wherein a resolution of the digital to analog converter is within a range of 4-8 bits.

19. The method of claim 16, wherein the digital to analog converter enables a dynamic remapping of a range of gain settings of the variable gain amplifier.

20. The method of claim 16, wherein the main differential pair of transistors and the internal pair of transistors are scaled relative to each other by a factor of K, where K is an integer greater than or equal to 1.

* * * * *